United States Patent [19]
Iwatare et al.

[11] Patent Number: 5,255,160
[45] Date of Patent: Oct. 19, 1993

[54] ELECTRONIC DEVICE PACKAGE

[75] Inventors: Misao Iwatare, Tokyo; Toshimasa Umetsu, Miyagi; Toshio Nakanishi, Tokyo; Makoto Moribe, Tokyo; Keijiro Kadomatsu, Tokyo; Toshiki Shimasaki, Tokyo; Satoru Onodera, Tokyo, all of Japan

[73] Assignee: NEC Corporation, Tokyo, Japan

[21] Appl. No.: 804,382

[22] Filed: Dec. 10, 1991

[30] Foreign Application Priority Data

Dec. 12, 1990 [JP] Japan .................................. 2-402947[U]
Jan. 31, 1991 [JP] Japan .................................. 3-16142[U]

[51] Int. Cl.$^5$ ........................ H05K 7/14; H01R 13/62
[52] U.S. Cl. .................................... 361/798; 361/729; 439/152; 439/157; 439/160
[58] Field of Search ............... 211/41; 361/393, 394, 361/399, 413, 415; 439/152, 153, 155, 157, 160

[56] References Cited

U.S. PATENT DOCUMENTS 4,798,923  1/1989  Barwick et al. ...................... 361/399
5,140,501  8/1992  Takahashi et al. .................. 361/415

*Primary Examiner*—Leo P. Picard
*Assistant Examiner*—Donald A. Sparks
*Attorney, Agent, or Firm*—Laff, Whitesel, Conte & Saret

[57] ABSTRACT

An electronic device package accommodatable in an electronic device casing. When a high density multipin connector is caused to mate with a connector mounted on the casing, the former is once brought to a stop just before mating with the latter and, therefore, prevented from rapidly mating with the latter. This eliminates the damage to the body of the connector and the deformation of the pins of the connector.

3 Claims, 5 Drawing Sheets

ELECTRONIC DEVICE PACKAGE

BACKGROUND OF THE INVENTION

The present invention relates to an electronic device package accommodatable in a casing.

The package density available with electronic device packages is increasing in parallel with the increase in signal speed and the miniaturization of component parts. Therefore, there is an increasing demand for a multipin miniature connector capable of connecting the package to a casing. While the contact portion of the connector is also decreasing in size to in turn increase the number of pins per unit area, the mechanical strength of isolating material implementing the connector body and the mechanical strength of metal forming the contact portion remain unchanged.

The problem with such a conventional electronic device package with a dense multipin connector is that the connector should be received in a casing under extremely strict conditions. Specifically, when the package is inserted into or pulled out of a casing by an ordinary operation, it is likely that the connector body is damaged or the pins of the contact portion are bent.

SUMMARY OF THE INVENTION

It is, therefore, an object of the present invention to provide an electronic device package which can be inserted into a casing without having a dense multipin connector thereof damaged.

It is another object of the present invention to provide a generally improved electronic device package accommodatable in a casing.

In accordance with the present invention, an electronic device package accommodatable in an electronic device casing comprises a printed circuit board having a connector for mating with a connector which is mounted on the casing, an ejector rotatably mounted on the printed circuit board and movable into and out of the casing, and an elastic member located in front of the ejector for restricting the rotation of the ejector.

Also, in accordance with the present invention, and electronic device package accommodatable in an electronic device casing has a printed circuit board having a connector for mating with a connector which is mounted on the casing. The printed circuit board is formed with a notch in the front lower edge thereof. An elastic plate is affixed to the printed circuit board and has substantially the same thicknesswise dimension as the printed circuit board. The elastic plate is formed with an open portion at the lower end thereof which is so dimensioned as to be received in the notch and has outwardly extending lugs. An ejector is rotatably mounted on the printed circuit board and capable of holding the resilient plate from opposite sides. The ejector is rotated to press the lugs of the elastic plate to thereby close the plate or rotated to release the lugs to thereby open the plate.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENTS

Figure 1:
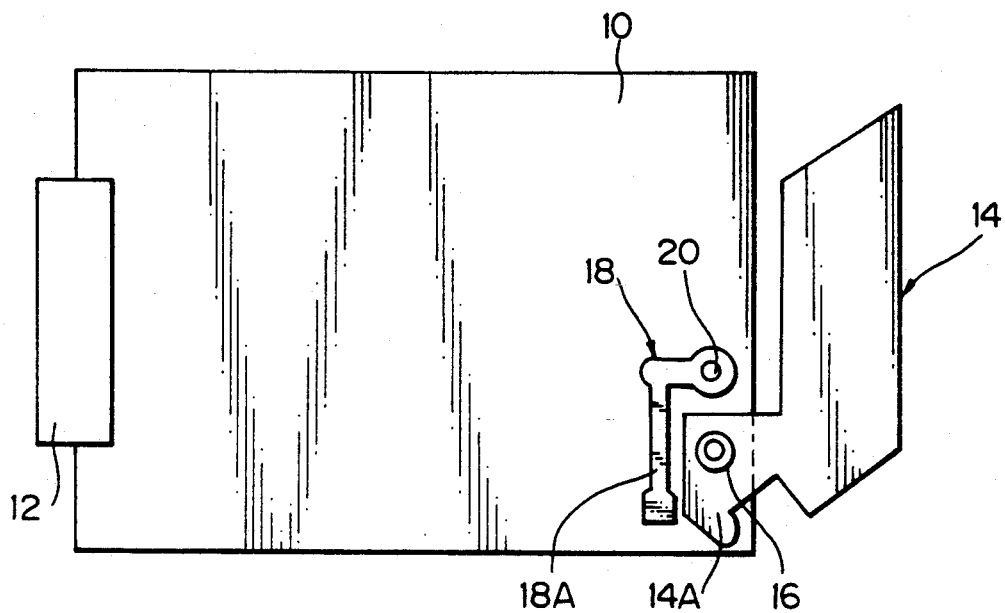
FIG. 1 is a side elevation of an electronic device package embodying the present invention.
Figure 2:
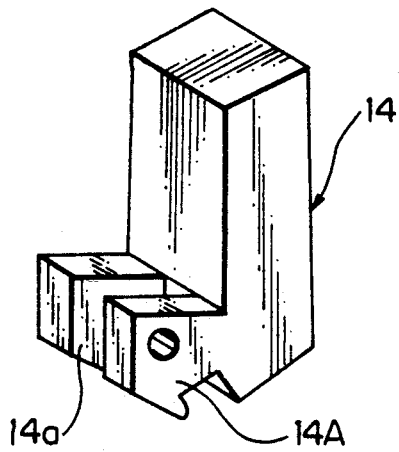
FIG. 2 is a perspective view showing an ejector included in the embodiment in detail.
Figure 3:
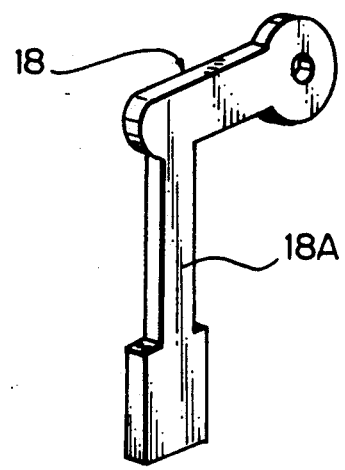
FIG. 3 is a perspective view of an elastic member also included in the embodiment.

Referring to FIG. 1 of the drawings, an electronic device package embodying the present invention is shown and includes a printed circuit board 10. A high density multipin connector 12 is affixed to one side edge of the printed circuit board 10 for connecting the package to a casing. An ejector 14 is rotatably connected by a shaft 16 to the printed circuit board 10 in the vicinity of the lower edge adjacent to the other side edge. The ejector 14 allows the package to be inserted into and pulled out of the casing. An elastic member 18 is affixed to the circuit board 10 by a screw 20 in the vicinity of the edge where the ejector 14 is located. As shown in FIG. 2, the ejector 14 has a groove 14a at one end 14A thereof to be capable of receiving the printed circuit board 10 therein. As shown in FIG. 3, the elastic member 18 has a generally crank-like configuration and is positioned such that the downward extension 18A as viewed in FIG. 3 faces the front face of the end 14A of the ejector 14.

Figure 4:
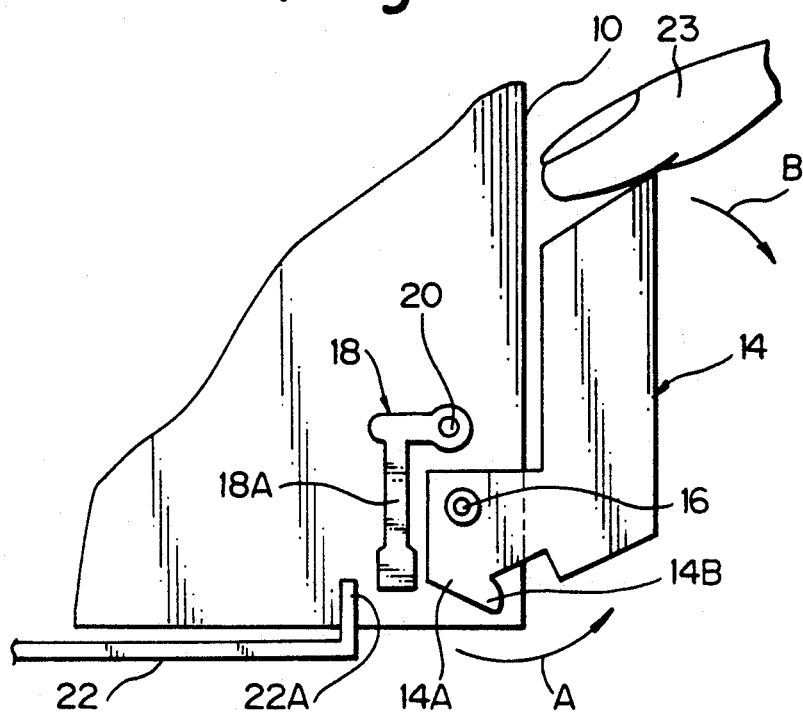
FIGS. 4 and 5 are views demonstrating the operation of the embodiment.
Figure 5:
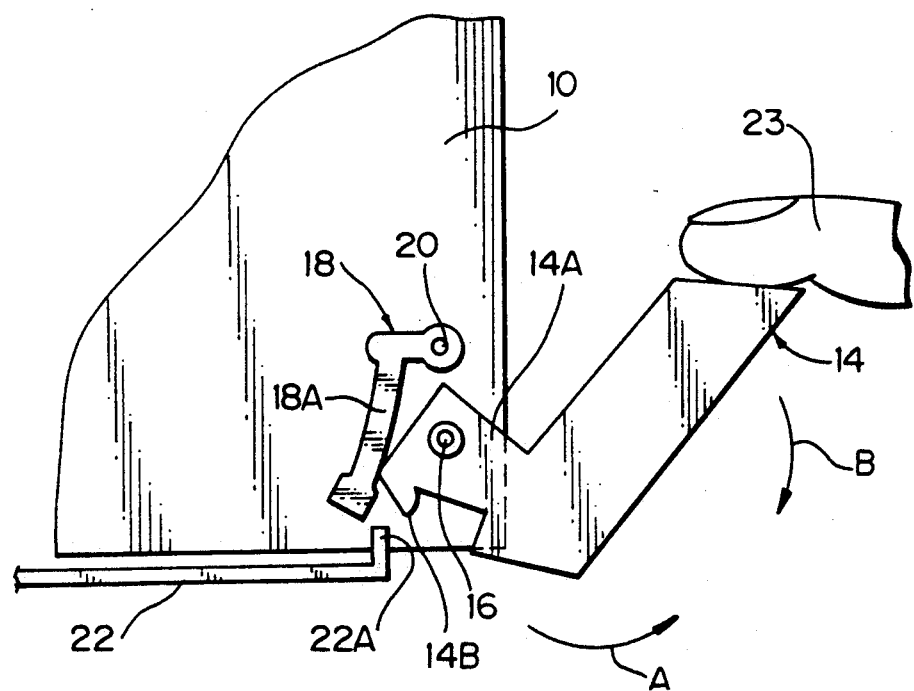

In operation, the ejector 14 of the electronic device package is received in the casing 22 of equipment in a manner shown in FIG. 4. In this condition, the elastic member 18 constantly biases the ejector 14 in a direction indicated by an arrow A in FIG. 4. Assume that the operator moves the ejector 14 to a direction shown in FIG. 5 by finger 23 in a direction indicated by an arrow B. Then, a lug 14B extending from the end 14A of the ejector 14 is allowed to move past an upright guide portion 22 included in the casing 22 without contacting it. Consequently, the multipin connector 12 can be connected to a connector, not shown, which is mounted on the back wiring board of the casing 22.

As stated above, the elastic member 18 is positioned in front of the ejector 14 for restricting the rotation of the ejector 14. So long as the ejector 14 is free from manual forces, it is held in an upright position by the elastic member 18. The operator, therefore, cannot insert or pull the printed circuit board 10 into or out of the equipment casing 22 unless the operator exerts a force on the ejector 14 to incline the latter. This is successful in protecting the body of the connector 12 from damage and in preventing the pins of the contact portion from being bent or otherwise deformed due to the forcible insertion or removal of the circuit board 10.

Figure 6:
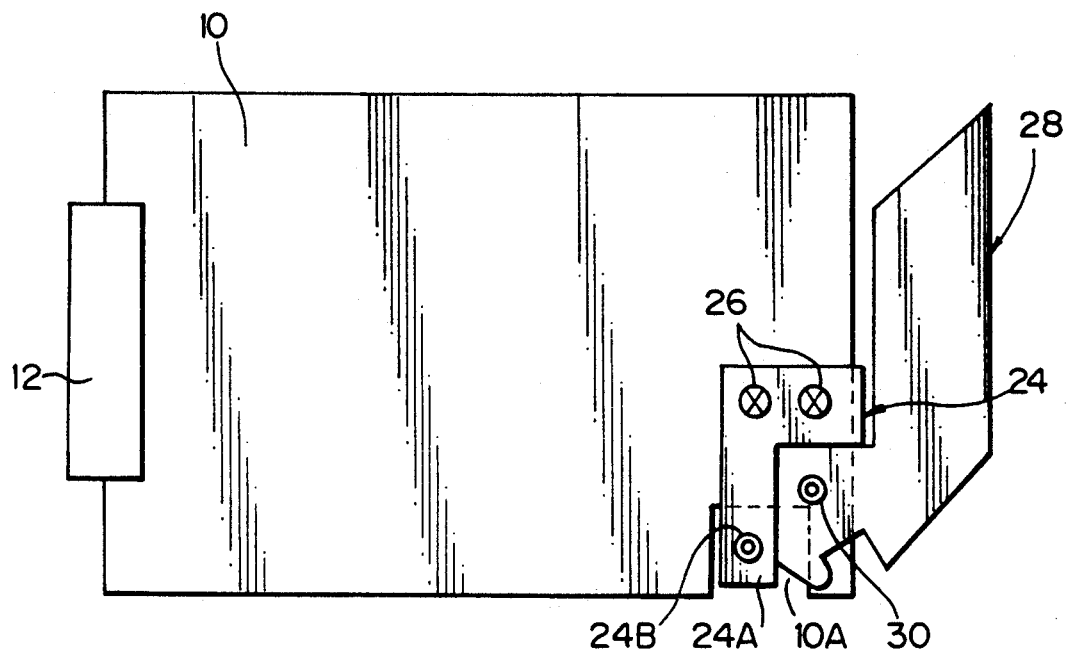
FIG. 6 is a side elevation showing an alternative embodiment of the present invention.
Figure 7:
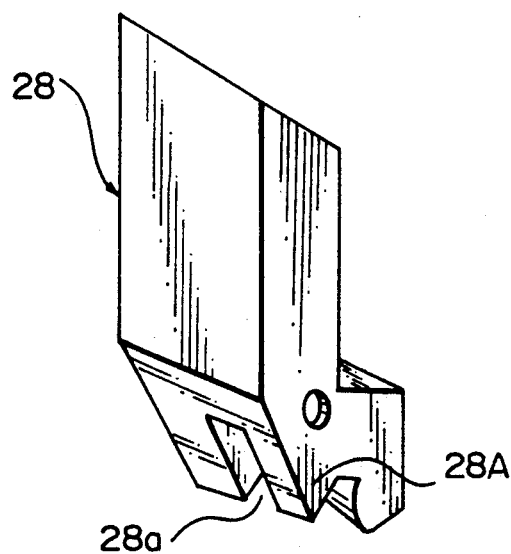
FIG. 7 is a perspective view of an ejector included in the alternative embodiment.
Figure 8:
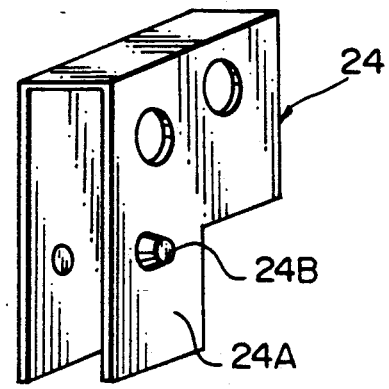
FIG. 8 is a perspective view of a metal plate also included in the alternative embodiment.

Referring to FIG. 6, an alternative embodiment of the present invention will be described. In FIG. 6, the same or similar component parts as those shown in FIG. 1 are designated by the same reference numerals, and redundant description will be avoided for simplicity. As shown, the connector 12 is capable of mating with a connector, not shown, mounted on the back wiring board of the casing 22 (see FIGS. 9-12). An elastic plate 24 is made of metal and affixed to the printed wire board 12 by screws 26 at the side opposite to the side where the connector 12 is located. The plate 24 has the open lower end portion 24A thereof so sized as to be capable of being received in a notch 10A which is formed in the front lower edge of the wire board 12. An ejector 28 is rotatably connected to the wire board 12 by a shaft 30 in the vicinity of the front edge of the wire board 12. The ejector 28 is movable into and out of the equipment body 22. As shown in FIG. 8, the plate 24 has substantially the same thickness as the printed circuit board 10. Lugs 24B extend outward or sideways from the lower end 24A of the plate 24. As shown in FIG. 7, a groove 28a is formed in one end 28A of the ejector 28 to receive the printed circuit board 10 therein. The plate 24 is sized such that it can be received in the groove 28a. When the ejector 28 is rotated about the shaft 30, it presses the lugs 24B of the elastic plate 24 or releases the latter to thereby close or open the plate 24. More specifically, the plate 24 has the lugs 24B thereof positioned on the locus of rotation of the ejector 28 and tends to expand in the thicknesswise direction of the circuit board 10.

Figure 9:
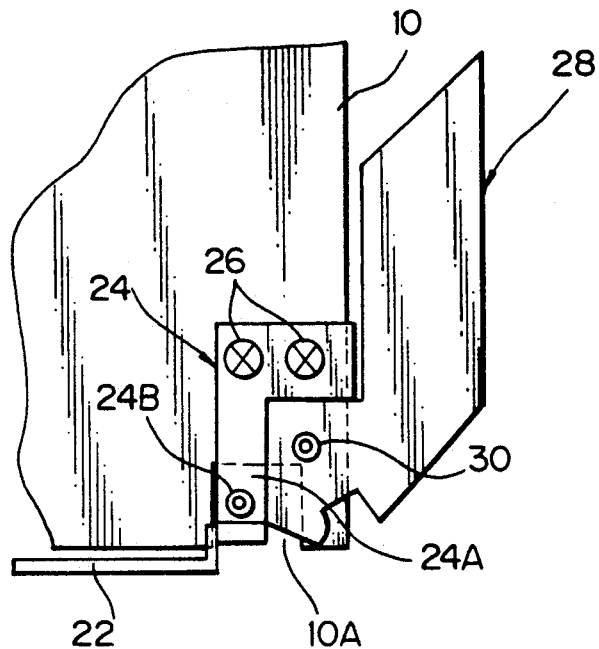
FIGS. 9-12 show the operation of the alternative embodiment.
Figure 10:
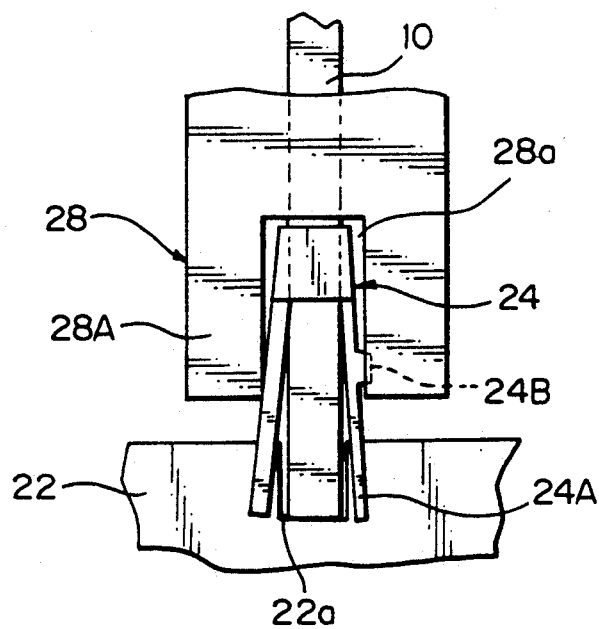
Figure 11:
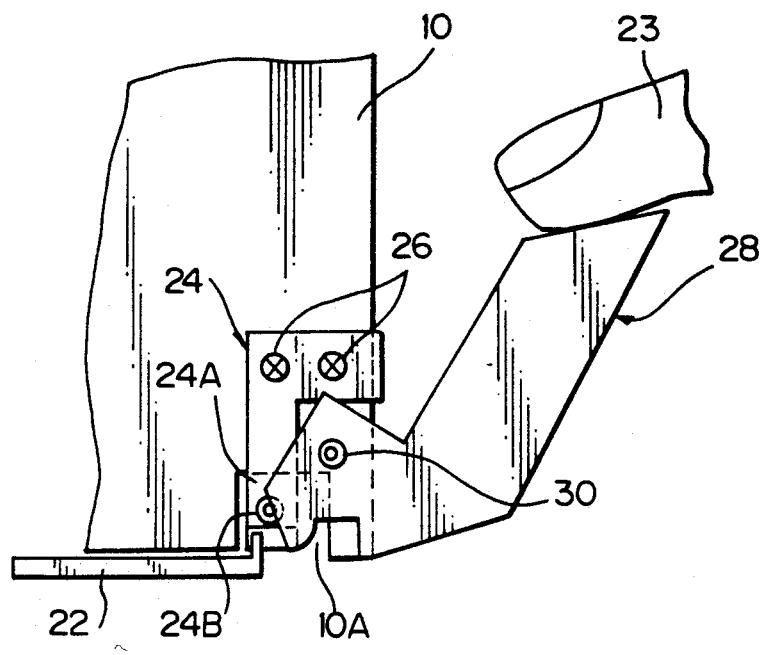
Figure 12:
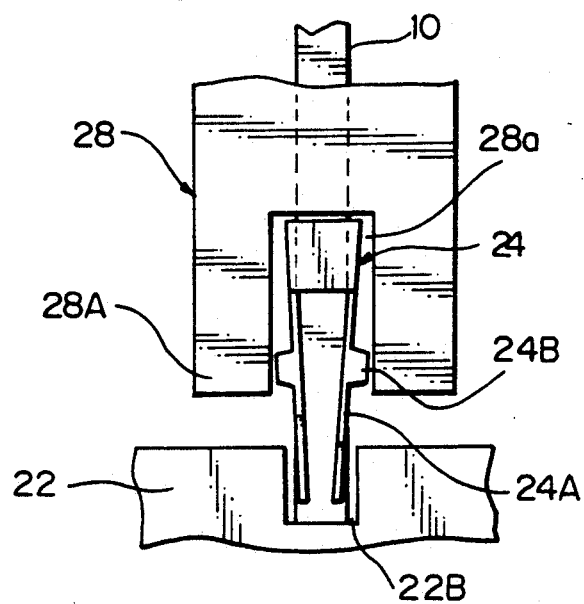

In operation, the ejector 28 of the package is received in the casing 22 in the position shown in FIG. 9. In this condition, the elastic plate 24 remains in the expanded position due to the elasticity thereof, as shown in FIG. 10. Since the lower end 24A of the plate 24 is wider than a guide groove 22a formed in the casing 22, the package is once brought to a stop. Subsequently, the ejector 28 is rotated about the shaft 30, as shown in FIGS. 11 and 12. Then, the lugs 24B enter the groove 28a of the ejector 28, and the plate 24 is accommodated in the notch 10A of the printed circuit board 10. Since the guide groove 22a of the casing 22 has substantially the same widthwise dimension as the printed circuit board 10, the package can readily move past past the groove 22a until the connector 12 mates with the connector, not shown, mounted on the casing 22.

As described above in the illustrative embodiment, the printed printed circuit board 10 has the notch 10A in the front lower edge thereof, while the elastic plate 24 has substantially the same thickness as the printed circuit board 10 and has the lugs 24B extending sidways therefrom. The ejector 28 closes the plate 24 by pressing the lugs 24B or opens it by releasing the lugs 24B. As a result, the package is once brought to a stop just before the connector 12 of the package mates with the connector of the casing 22, preventing the former from rapidly mating with the latter. This is also successful in eliminating the damage to the connector and the deformation of the pins.

Various modifications will become possible for those skilled in the art after receiving the teachings of the present disclosure without departing from the scope thereof.

What is claimed is:

1. An electronic device package accommodatable in an electronic device casing, comprising:
    a printed circuit board having a connector for mating with a connector which is mounted on said casing, said printed circuit board being formed with a notch in the front lower edge thereof;
    elastic mechanical plate means affixed to said printed circuit board and having substantially the same thickness dimension as said printed circuit board, said elastic mechanical plate means being formed with an open portion at the lower end thereof which is so dimensioned as to be received in said notch and having outwardly extending lugs; and
    ejector means rotatably mounted on said printed circuit board and capable of holding said elastic mechanical plate means from opposite sides;
    said ejector means being rotated to press said lugs of said elastic plate to close said elastic mechanical plate means or rotated to release said lugs to open said elastic plate means.

2. A package as claimed in claim 1, wherein said ejector means is formed with a groove capable of receiving said printed circuit board therein.

3. A package as claimed in claim 1, wherein said elastic mechanical plate means is deformed only when closed by said ejector means so as to pass a guide groove formed in said casing.

* * * * *